(12) United States Patent
Takai

(10) Patent No.: US 7,689,015 B2
(45) Date of Patent: Mar. 30, 2010

(54) MAGNETIC RESONANCE IMAGING APPARATUS AND IMAGE CORRECTION ESTIMATING METHOD

(75) Inventor: Hiroshi Takai, Nasushiobara (JP)

(73) Assignees: Kabushiki Kaisha Toshiba, Tokyo (JP); Toshiba Medical Systems Corporation, Otawara-shi (JP)

( * ) Notice: Subject to any disclaimer, the term of this patent is extended or adjusted under 35 U.S.C. 154(b) by 1065 days.

(21) Appl. No.: 11/319,775

(22) Filed: Dec. 29, 2005

(65) Prior Publication Data
US 2007/0280520 A1 Dec. 6, 2007

(51) Int. Cl.
*G06K 9/00* (2006.01)

(52) U.S. Cl. .................................. 382/128; 128/922

(58) Field of Classification Search ................ 382/100, 382/128, 130, 131, 132; 128/922; 378/4–27; 600/407, 410, 425, 524
See application file for complete search history.

(56) References Cited

U.S. PATENT DOCUMENTS

| | | | | |
|---|---|---|---|---|
| 5,113,865 A | * | 5/1992 | Maeda et al. | 600/410 |
| 5,251,128 A | * | 10/1993 | Crawford | 600/425 |
| 6,057,685 A | * | 5/2000 | Zhou | 324/306 |
| 6,597,936 B1 | * | 7/2003 | Liu et al. | 600/420 |
| 7,187,810 B2 | * | 3/2007 | Clune et al. | 382/294 |
| 7,324,624 B2 | * | 1/2008 | Sibomana et al. | 378/19 |
| 2004/0010191 A1 | | 1/2004 | Yatsui | |

OTHER PUBLICATIONS

Michiels et al., "On the Problem of Geometric Distortion in Magnetic Resonance Images for Stereotactic Neurosurgery", Magnetic Resonance Imaging, vol. 12, No. 5, pp. 749-765, 1994.

* cited by examiner

*Primary Examiner*—Anand Bhatnagar
(74) *Attorney, Agent, or Firm*—Nixon & Vanderhye P.C.

(57) ABSTRACT

A magnetic resonance imaging apparatus comprises an imaging condition setting unit, a receiving unit, an image reconstructing unit, an image distortion correcting unit and an image correction estimating unit. The imaging condition setting unit sets mutually different image conditions. The receiving unit receives magnetic resonance signals from an imaging area according to the image conditions. The image reconstructing unit reconstructs a plurality of image data corresponding to the image conditions respectively based on the magnetic resonance signals. The image distortion correcting unit corrects distortions of the plurality of the image data based on a magnetic field distribution on the imaging area. The image correction estimating unit estimates whether a correction of at least one of the plurality of the image data is appropriate based on a plurality of corrected image data.

24 Claims, 5 Drawing Sheets

MAGNETIC RESONANCE IMAGING APPARATUS AND IMAGE CORRECTION ESTIMATING METHOD

BACKGROUND OF THE INVENTION

1. Field of the Invention

The present invention relates to a magnetic resonance imaging apparatus and an image correction estimating method which excite nuclear spin of an object magnetically with a RF signal having the Larmor frequency and reconstruct an image based on a magnetic resonance signal generated due to the excitation, and more particularly, to a magnetic resonance imaging apparatus and an image correction estimating method, which estimate whether correction for image distortion due to nonuniformity on a magnetic field was performed appropriately.

2. Description of the Related Art

Conventionally, a MRI (Magnetic Resonance Imaging) apparatus is used for a monitoring apparatus in medical field.

The MRI apparatus is an apparatus which magnetically resonates nuclear spins in an object by transmitting a RF (radio frequency) signal from a RF coil with forming gradient magnetic fields by gradient coils in X-axis, Y-axis and Z-axis directions on an imaging area of the object set in a cylindrical magnet generating a static magnetic field and reconstructs an image of the object using a nuclear magnetic resonance (NMR) signal generated due to the excitation.

The MRI apparatus as described above has a problem that uniformity of intensities of a static magnetic field is partly disturbed by the performance limitation of a magnet for static magnetic field forming a static magnetic field and the variation in magnetic susceptibility when an object enters a magnetic field. It is well-known that a reconstructed image is distorted when the uniformity of intensities of a static magnetic field is disturbed.

The serious influence from nonuniformity of intensities of a static magnetic field is affected in the case of imaging on EPI (echo planar imaging) method. The EPI method is a super-fast scan method for obtaining all data for reconstruction of image by one-time excitation pulse, and is also called single-shot EPI method. The imaging using the EPI method is performed so as to prevent the influences from the body movement and the pulsating of an object in the case of drawing the cerebral infarction in the examination of the head of the object. However, a diffusion weighted image obtained by using the EPI method is greatly influenced from the nonuniformity of intensities of a static magnetic field. When the intensities of a static magnetic field are not sufficiently uniform, the reconstructed image is distorted.

Then, in order to solve the problem caused by the nonuniformity of intensities of a static magnetic field, according to a conventional art, the distribution of intensities of a static magnetic field is estimated, and an image position and an image value of the reconstructed image are corrected based on the above-estimated distribution of intensities of the static magnetic field (for example, refer to a document, "Geometric distortion in MRI for stereotactic neurosurgery" on pp. 749 to 765 of Magnetic Resonance Imaging, Volume 12, Number 5, 1994 written by J. MICHIELS ET AL).

There are three factors for disturbing uniformity of intensities of a static magnetic field and distorting reconstructed image. That is, a first factor is an error of a gradient magnetic field, a second factor is an error of a static magnetic field due to only a magnet for static magnetic field, and a third factor is an error of the static magnetic field due to an object entering the static magnetic field. Therefore, the error of the static magnetic field is defined by the total of the error of the gradient magnetic field, the error of the static magnetic field due to only the magnet for static magnetic field, and the error of the static magnetic field due to the object which enters the static magnetic field.

Further, the amount of distortion of the image data is obtained every position in an image space from the error of the static magnetic field, an image value is corrected every position in the image space based on the obtained amount of distortion of the image data. That is, in the image space, the three-dimensional positions each having an image value are first shifted to the positions without the distortion. However, the shifted positions are not necessarily on the original grid points, and image values on the grid points are therefore obtained by the interpolation using a plurality of image values at the shifted positions.

In the conventional correction of the image distortion due to the nonuniform intensities of a static magnetic field, importantly in precision, the distribution of distortion amounts of the static magnetic field is estimated in accordance with the error factors of the static magnetic field. In particular, since the error of the static magnetic field which is caused by the entering of the object in the static magnetic field varies depending on the movement of the object, estimated values of the error distribution of the static magnetic field can include errors.

Then, in the image correction based on the error distribution of the static magnetic field without precisely estimating the error distribution of the static magnetic field, there is a danger that the image distortion is not appropriately improved. Therefore, such the development of a technique is expected whether or not the error distribution of the static magnetic field is precisely estimated, alternatively whether or not the image distortion due to the nonuniformity of a static magnetic field is appropriately corrected.

SUMMARY OF THE INVENTION

The present invention has been made in light of the conventional situations, and it is an object of the present invention to provide a magnetic resonance imaging apparatus and an image correction estimating method which estimate an error distribution of a static magnetic field formed in an imaging area appropriately and determine whether correction for image distortion due to nonuniformity on the static magnetic field was performed appropriately.

The present invention provides a magnetic resonance imaging apparatus comprising: an imaging condition setting unit configured to set mutually different image conditions; a receiving unit configured to receive magnetic resonance signals from an imaging area according to the image conditions; an image reconstructing unit configured to reconstruct a plurality of image data corresponding to the image conditions respectively based on the magnetic resonance signals; an image distortion correcting unit configured to correct distortions of the plurality of the image data based on a magnetic field distribution on the imaging area; and an image correction estimating unit configured to estimate whether a correction of at least one of the plurality of the image data is appropriate based on a plurality of corrected image data, in an aspect to achieve the object.

The present invention also provides an image correction estimating method comprising steps of: setting mutually different image conditions; receiving magnetic resonance signals from an imaging area according to the image conditions; reconstructing a plurality of image data corresponding to the image conditions respectively based on the magnetic resonance signals; correcting distortions of the plurality of the image data based on a magnetic field distribution on the imaging area; and estimating whether a correction of at least one of the plurality of the image data is appropriate based on a plurality of corrected image data, in an aspect to achieve the object.

The magnetic resonance imaging apparatus and the image correction estimating method according to the present invention as described above make it possible to estimate an error distribution of a static magnetic field formed in an imaging area appropriately and determine whether correction for image distortion due to nonuniformity on the static magnetic field was performed appropriately.

DESCRIPTION OF THE PREFERRED EMBODIMENTS

A magnetic resonance imaging apparatus and an image correction estimating method according to an embodiment of the present invention will be described with reference to the accompanying drawings.

Figure 1:
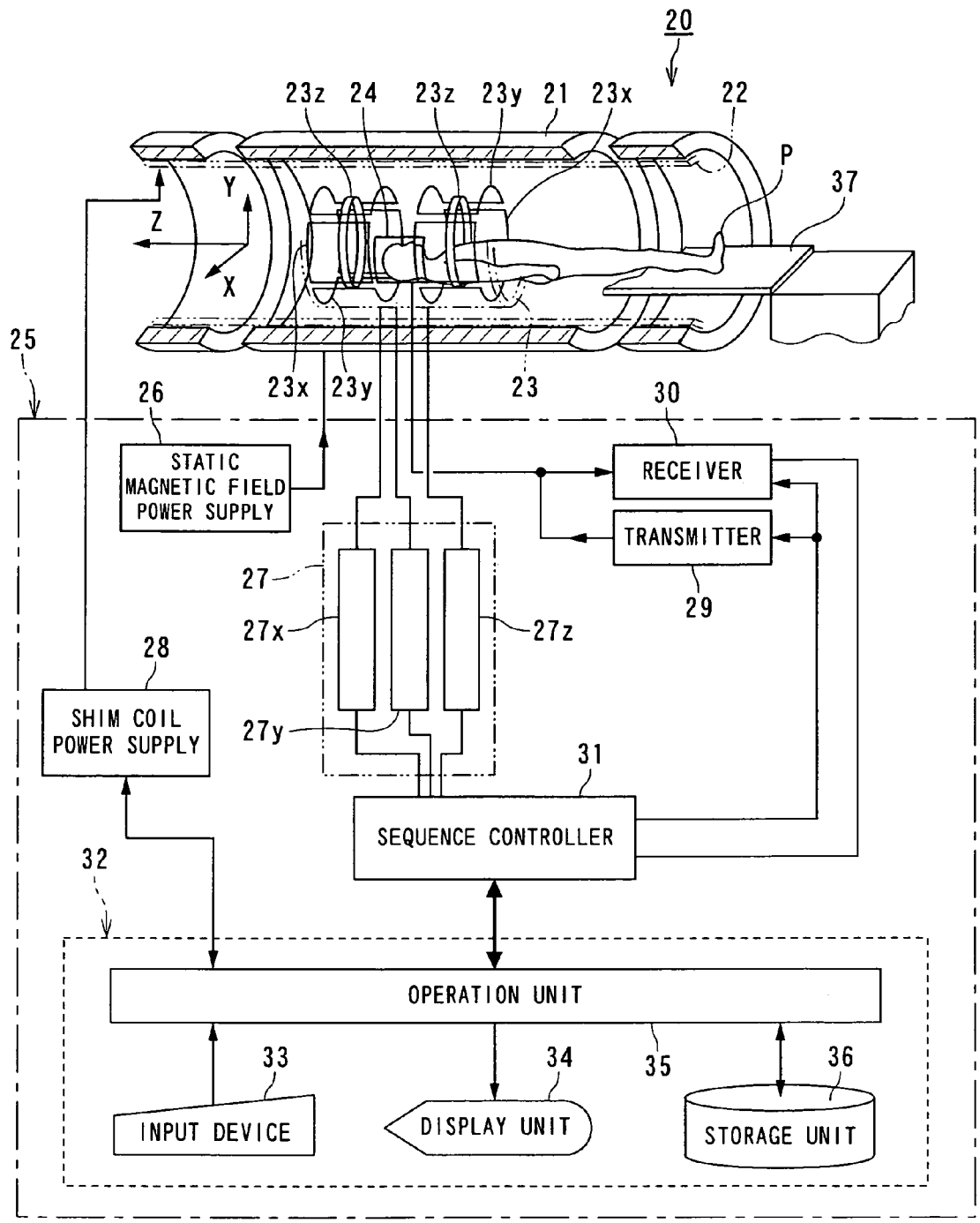
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil unit 23 and a RF coil 24. The static field magnet 21, the shim coil 22, the gradient coil unit 23 and the RF coil 24 are built in a gantry (not shown).

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a monitor 34, a operation unit 35 and a storage unit 36.

The static field magnet 21 communicates with the static magnetic field power supply 26. The static magnetic field power supply 26 supplies electric current to the static field magnet 21 to get the function to generate a static magnetic field in a imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil unit 23 includes an X-axis gradient coil unit 23x, a Y-axis gradient coil unit 23y and a Z-axis gradient coil unit 23z. Each of the X-axis gradient coil unit 23x, the Y-axis gradient coil unit 23y and the Z-axis gradient coil unit 23z which is cylinder-shaped is arranged inside the static field magnet 21. The gradient coil unit 23 has also a bed 37 in the area formed inside it which is an imaging area. The bed 37 supports an object P. Around the bed 37 or the object P, the RF coil 24 may be arranged instead of being built in the gantry.

The gradient coil unit 23 communicates with the gradient power supply 27. The X-axis gradient coil unit 23x, the Y-axis gradient coil unit 23y and the Z-axis gradient coil unit 23z of the gradient coil unit 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil unit 23x, the Y-axis gradient coil unit 23y and the Z-axis gradient coil unit 23z respectively so as to generate gradient magnetic fields Gx, Gy and Gz in the X, Y and Z directions in the imaging area.

The RF coil 24 communicates with the transmitter 29 and the receiver 30. The RF coil 24 has a function to transmit a RF signal given from the transmitter 29 to the object P and receive a MR signal generated due to an nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to an imaging condition defined by a predetermined pulse sequence stored. The control information above-described includes motion control information, such as intensity, impression period and impression timing of the pulse electric current which should be impressed to the gradient power supply 27

The sequence controller 31 is also configured to give raw data to the computer 32. The raw data is complex number data obtained through the detection of a MR signal and A/D conversion to the MR signal detected in the receiver 30.

The transmitter 29 has a function to give a RF signal to the RF coil 24 in accordance with control information provided from the sequence controller 31. The receiver 30 has a function to generate raw data which is digitized complex number data by detecting a MR signal given from the RF coil 24 and performing predetermined signal processing and A/D converting to the MR signal detected. The receiver 30 also has a function to give the generated raw data to the sequence controller 31.

With the elements, i.e., the static field magnet 21 the shim coil 22 the gradient coil unit 23, the RF coil 24 and the control system 25, the magnetic resonance imaging apparatus 20 impresses a gradient magnetic field and transmits a RF signal to the object P in a static magnetic field in accordance with imaging condition determined as a pulse sequence and generates raw data by receiving a MR signal produced with a nuclear magnetic resonance of a nucleus due to a RF signal in the object P and digitizing the received MR signal.

The computer 32 gets various functions by the operation unit 35 executing some programs stored in the storage unit 36 of the computer 32. The computer 32 may include some specific circuits instead of using some of the programs.

Figure 2:
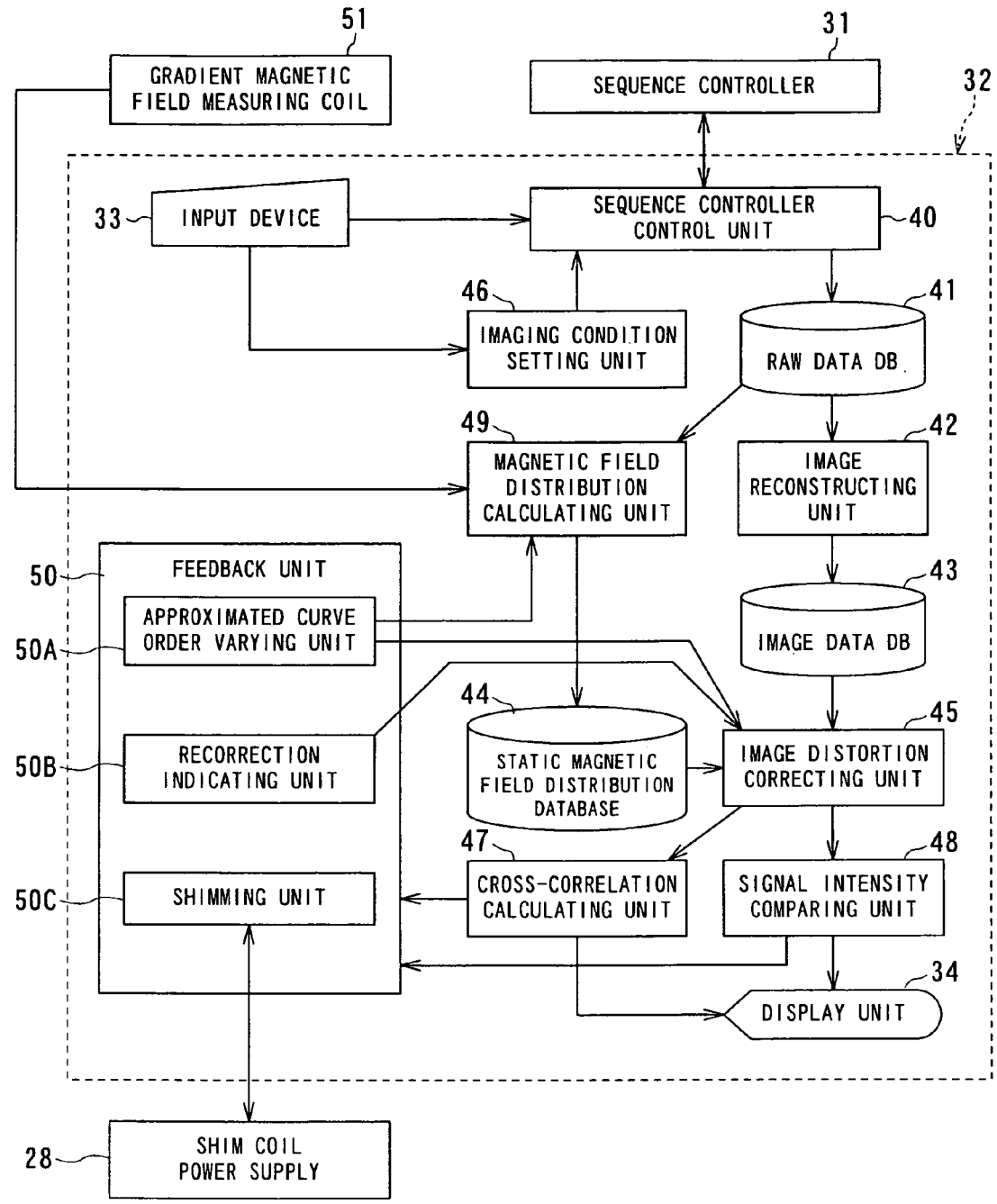
FIG. 2 is a functional block diagram of the computer 32 in the magnetic resonance imaging apparatus 20 shown in FIG. 1.

FIG. 2 is a functional block diagram of the computer 32 in the magnetic resonance imaging apparatus 20 shown in FIG. 1.

An image correction estimating program functions the computer 32 as a sequence controller control unit 40, a raw data database 41, an image reconstructing unit 42, an image data database 43, a static magnetic field distribution database 44, an image distortion correcting unit 45, an imaging condition setting unit 46, a cross-correlation calculating unit 47, a signal intensity comparing unit 48, a magnetic field distribution calculating unit 49 and a feedback unit 50. Each of the cross-correlation calculating unit 47 and the signal intensity comparing unit 48 serves as an example of image correction estimating unit. The feedback unit 50 has an approximated curve order varying unit 50A, a recorrection indicating unit 50B and a shimming unit 50C.

The sequence controller control unit 40 has a function for controlling the driving of the sequence controller 31 by giving predetermined pulse sequence to the sequence controller 31 based on information from the input device 33 or another element. The sequence controller control unit 40 also has a function for receiving raw data from the sequence controller 31 and arranging the raw data to k space (Fourier space) formed in the raw data database 41.

The imaging condition setting unit 46 has a function for setting an imaging condition by generating a pulse sequence and giving the generated pulse sequence to the sequence controller control unit 40. Note that, the imaging condition setting unit 46 has a function to generate a pulse sequence for performing a preparation scanning to measure a distribution of a static magnetic field as well as a plurality of pulse sequences so that a plurality of scanning are performed according to some kinds of imaging conditions in which polar characters of gradient magnetic fields are reversed to each other in at least one direction of a phase encode (PE) direction, a read out (RO) direction and a slice encode (SE) direction.

In other words, the imaging condition setting unit 46 is configured to be able to set imaging conditions for acquiring images (imaging) so as to obtain images having sufficient difference in pixel values (or signal intensities, hereafter, the notation may be omitted). Here, difference in pixel values means each difference between corresponding positions of images. Imaging conditions for acquiring images having sufficient difference in pixel values can be set easily by reversing polarities of gradient magnetic fields each other.

Other methods for obtaining a sufficient difference in pixel values or signal values on corresponding positions respectively includes setting imaging conditions in which relaxation times such as T1 (longitudinal) relaxation. time and T2 (transverse) relaxation time are different each other or in which imaging methods such as FE (field echo) method and SE (spin echo) method are different each other.

Therefore, as long as imaging conditions to be set are those for acquiring images having sufficient difference in pixel values, they may be set by other method than one for reversing polarities of gradient magnetic fields each other. Hereafter, a case of setting imaging conditions by reversing polarities of gradient magnetic fields each other will be described.

Note that, an example of pulse sequences to be set for acquiring images as imaging conditions is EPI sequences. It is known that imaging according to EPI sequence is especially influenced strongly of the uniformity of static magnetic field intensity.

Therefore, the raw data database 41 stores each of the raw data generated in the receiver 30 by scanning according to each of the imaging conditions set by the imaging condition setting unit 46, and each raw data are arranged to the k space formed in the raw data database 41 every imaging condition. In addition, when a preparation scanning to measure a distribution of a static magnetic field was performed, raw data to measure a distribution of a static magnetic field are stored in the raw data database 41.

The image reconstructing unit 41 has a function for capturing the raw data from the raw data database 42, performing predetermined image reconstruction processing, such as Fourier transform processing or maximum intensity projection (MIP) processing, reconstructing image data of the object P, and writing the image data to the image data database 43. Incidentally, image data other than those of an object P, such as image data of a phantom, may be reconstructed when diagnosis is not performed.

Therefore, the image data database 43 stores the three dimensional image data of the object P or a phantom every imaging condition.

The static magnetic field distribution database 44 stores a static magnetic field distribution measured or calculated in advance. The static magnetic field distribution database 44 may store a static magnetic field distribution calculated by the magnetic field distribution calculating unit 49.

The image distortion correcting unit 45 has a function for correcting each distortion on image data of an object P or a phantom stored in the image data database 43 every imaging condition according to a static magnetic field distribution read from the static magnetic field distribution database 44 and giving each corrected image data to the cross-correlation calculating unit 47 and the signal intensity comparing unit 48.

The cross-correlation calculating unit 47 has a function for receiving each corrected image data obtained through the imaging conditions from the image distortion correcting unit 45 and obtaining a cross-correlation coefficient between image data. The cross-correlation calculating unit 47 also functions as an image correction estimating unit for estimating whether a correction of image data performed appropriately based on the obtained cross-correlation coefficient. Furthermore, the cross-correlation calculating unit 47 gives estimation result of whether each correction on the obtained cross-correlation coefficient between the image data or the image data was performed appropriately to the display unit 34 to be displayed on it, as necessary.

Methods for evaluating whether correction is appropriate include a method for comparing a cross-correlation coefficient between image data with a predetermined threshold for the cross-correlation coefficient. In this method, when the cross-correlation coefficient is and above or above the threshold, evaluation is that correction is appropriate. On the contrary, when the cross-correlation coefficient is below or and below the threshold, evaluation is that correction is not appropriate.

Then, the cross-correlation calculating unit 47 is configured to give a feedback instruction to the feedback unit 50 to make correction appropriate when evaluation is that correction is not appropriate. When a region in which evaluation is that correction is not appropriate is local, the region is also given to the feedback unit 50 from the cross-correlation calculating unit 47. Furthermore, shift amount of the cross-correlation coefficient from the threshold thereof is also given to the feedback unit 50 from the cross-correlation calculating unit 47, as necessary.

The signal intensity comparing unit 48 has a function for receiving each corrected image data obtained through the imaging conditions from the image distortion correcting unit 45 and comparing signal intensities between the image data every pixel. The signal intensity comparing unit 48 also functions as an image correction estimating unit for estimating whether a correction of image data performed appropriately based on a comparison result of signal intensities. Furthermore, the signal intensity comparing unit 48 gives estimation result of whether each correction of the image data was performed appropriately and a comparison result of signal intensities between the image data to the display unit 34 to be displayed on it, as necessary.

Methods for evaluating whether correction is appropriate include a method for comparing a difference value between signal intensities of image data with a predetermined threshold for the difference value between the signal intensities. In this method, when the difference value between the signal intensities is and above or above the threshold, evaluation is that correction is appropriate. On the contrary, when the difference value between the signal intensities is below or and below the threshold, evaluation is that correction is not appropriate.

Then, the signal intensity comparing unit 48 is configured to give a feedback instruction to the feedback unit 50 to make correction appropriate when evaluation is that correction is not appropriate. When a region in which evaluation is that correction is not appropriate is local, the region is also given to the feedback unit 50 from the signal intensity comparing unit 48. Furthermore, shift amount of the difference value between the signal intensities from the threshold thereof is also given to the feedback unit 50 from the signal intensity comparing unit 48, as necessary.

The magnetic field distribution calculating unit 49 has a function for estimating a distribution of a static magnetic field by an arbitrary method and writing the obtained static magnetic field distribution data the static magnetic field distribution database 44. On estimating a distribution of a static magnetic field, the magnetic field distribution calculating unit 49 refers to raw data for measuring a static magnetic field distribution stored in the raw data database 41, as needed. The magnetic field distribution calculating unit 49 may refer to a measurement result of a gradient magnetic field read from a gradient magnetic field measuring coil 51, arranged near an imaging area, for measuring a gradient magnetic field.

The static magnetic field distribution data calculated by the magnetic field distribution calculating unit 49 are desirably obtained as an approximated curve having an arbitrary order which connects positions with values of the static magnetic field in accordance with a value of the static magnetic field on each position. On obtaining an approximated curve, error data of the static magnetic field acquired by measurement or a design simulation are referred to. Like this, indication of the static magnetic field distribution data using an approximated curve make it possible to calculate an error of any point on which data should be corrected.

On the contrary, the static magnetic field distribution data estimated by the magnetic field distribution calculating unit 49 may not be an approximated curve, but may be a value of the static magnetic field on each position.

The feedback unit 50 has a function for feedback of evaluating results of the correction obtained by the cross-correlation calculating unit 47 and the signal intensity comparing unit 48 by an arbitrary procedure. That is, upon receiving a feedback instruction from the cross-correlation calculating unit 47 or the signal intensity comparing unit 48, the feedback unit 50 appropriately performs the correction by using at least one of the approximated curve order varying unit 50A, the recorrection indicating unit 50B, and the shimming unit 50C.

The approximated curve order varying unit 50A has: a function for sending an instruction for increasing the order of the approximated curve stored in the static magnetic field distribution database 44, as the static magnetic field distribution data, to the magnetic field distribution calculating unit 49 upon receiving a feedback instruction from the cross-correlation calculating unit 47 or the signal intensity comparing unit 48; and a function for sending an instruction for correcting the image data by using the static magnetic field distribution data newly obtained by the magnetic field distribution calculating unit 49 to the image distortion correcting unit 45. That is, the increase in the order of the approximated curve serving as the static magnetic field distribution data improves the approximating precision of the distribution of static magnetic field. As a consequence, it is considered that it is possible to improve precision of correction for image distortion based on the static magnetic field distribution data.

The approximated curve order varying unit 50A sends an instruction for increasing the order of the approximated curve to the magnetic field distribution calculating unit 49, and the magnetic field distribution calculating unit 49 recalculates the static magnetic field distribution data, thereby improving the precision of the static magnetic field distribution data which is stored in the static magnetic field distribution database 44. Then, the approximated curve order varying unit 50A sends an instruction for recorrecting the distortion of the image data by using the precision-improved distribution of static magnetic field to the image distortion correcting unit 45.

Note that, upon partly existing an area serving the determination that the distortion correction of the image data is not appropriate, in order to reduce the throughput, the precision of the static magnetic field distribution data can be improved only in the area serving the determination that the distortion correction of the image data is not appropriate.

The recorrection indicating unit SOB has: a function for sending an instruction for recorrecting the image data with varying, in one direction, values of the static magnetic field distribution data used for the correction to the image distortion correcting unit 45, upon receiving the feedback instruction from the cross-correlation calculating unit 47 or the signal intensity comparing unit 48; and a function for determining whether or not the varying direction of the static magnetic field distribution data is one for improving the correction.

It is determined, whether or not the varying direction of the static magnetic field distribution data is one for improving the correction, by determining whether or not to reduce the amount of divergence from a threshold of a cross-correlation coefficient or a differential value between the signal intensities after the recorrection by the image distortion correcting unit 45. Then, if the amount of divergence is reduced, the static magnetic field distribution data are varied again in the same direction. On the other hand, if the amount of divergence is increased, an instruction can be sent to the image distortion correcting unit 45 to recorrect the image data after varying the static magnetic field distribution data in the reverse direction. Further, by gradually decreasing the amount of variation in the static magnetic field distribution data again, the static magnetic field distribution data can be optimized.

That is, when the evaluation result for correction can be improved by varying the static magnetic field distribution data in one direction so as to recorrect the image data, the correcting the image data and varying the static magnetic field distribution data are repeated until the correction is appropriate. Such a convergent calculation makes the correction of the image data appropriate. On the other hand, when the evaluation result for recorrection is not improved, the recorrection is evaluated after reversing the varying direction of the static magnetic field distribution data. Then, by repeating the above-mentioned determination of the convergent direction and convergent calculation, the cross-correlation coefficient or the differential value between signal intensities becomes within a threshold therefor and it is determined that the correction is appropriate.

Note that, when the area serving the determination that the distortion correction of the image data is not appropriate partly exists, in order to reduce the throughput, the static magnetic field distribution data can be varied only in the area serving the determination that the distortion correction of the image data is not appropriate.

The shimming unit 50C has a function for allowing the shim coil power supply 28 to perform shimming by supplying a control signal to the shim coil power supply 28 upon receiving the feedback instruction from the cross-correlation calculating unit 47 or the signal intensity comparing unit 48. That is, current or voltage outputted from the shim coil power supply 28 to the shim coil 22 is controlled, thereby varying a shimming condition and improving the uniformity on distribution of a static magnetic field.

The improvement in uniformity on distribution of a static magnetic field further enables the improvement in correcting precision of the image data, thereby performing the appropriate correction. In the case of adjusting a shimming condition, a shimming condition table which is connected in advance with the shimming conditions and the uniformity on distribution of a static magnetic field can be referred to. The shimming condition table can be stored in the shimming unit 50C or can be referred to the shimming unit 50C if necessary.

Next, the operation of the magnetic resonance imaging apparatus 20 will be described.

Figure 3:
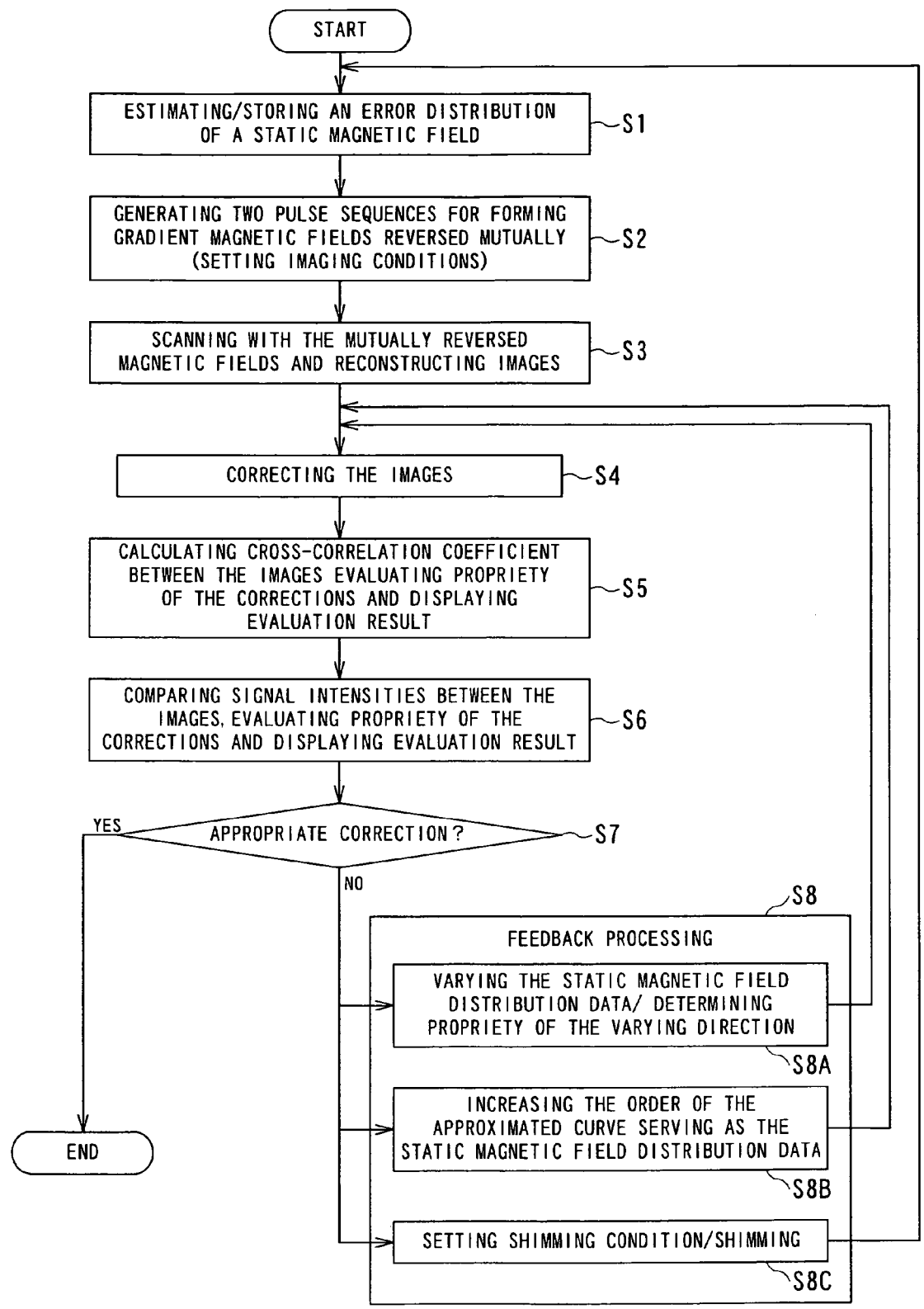
FIG. 3 is a flowchart showing an example of flow for estimating whether correction for image distortion due to nonuniformity on a static magnetic field was performed appropriately.

FIG. 3 is a flowchart showing an example of flow for estimating whether correction for image distortion due to nonuniformity on a static magnetic field was performed appropriately.

In step S1, the error distribution of the static magnetic field is estimated in advance by an arbitrary manner and is stored in the static magnetic field distribution database 44. The error distribution of the static magnetic field may be measured.

According to an evaluating approach of the error distribution of the static magnetic field, the generating factors of the error of the static magnetic field are classified into three factors including an error of the gradient magnetic field, an error of the static magnetic field due to only the magnet 21 for static magnetic field, and an error of the static magnetic field which is caused by the entering of the object P in the static magnetic field. The errors of the static magnetic field due to the factors are evaluated and then are added.

The error of the gradient magnetic field, as the first factor, is caused by an error to linearity of the gradient magnetic field which should be linear ideally. The amount of distortion of the static magnetic field based on the error of the gradient magnetic field is determined, independently of the intensity of the gradient magnetic field.

Reference symbols x, y and z denote coordinates of an arbitrary point in the gantry coordinate system in an imaging area. Then, the error of the gradient magnetic field has a three-dimensional distribution having gradients in channels in the x, y, and z directions respectively. Reference symbols Gx, Gy, and Gz denote intensity of ideally-linear gradient magnetic field. Then, the following Expression (1-1), Expression (1-2), and Expression (1-3) individually express ratios GxErrorRatio(x,y,z), GyErrorRatio(x,y,z) and GzErrorRatio(x,y,z) of errors of the gradient magnetic field in the channels in the x, y, and z directions. In this case, $\Delta Gx(x,y,z)$, $\Delta Gy(x,y,z)$, and $\Delta Gz(x,y,z)$ denote amounts of errors of the gradient magnetic field in the channels in the x, y, and z directions respectively.

$$GxErrorRatio(x,y,z)=\Delta Gx(x,y,z)/Gx \quad \text{Expression (1-1)}$$

$$GyErrorRatio(x,y,z)=\Delta Gy(x,y,z)/Gy \quad \text{Expression (1-2)}$$

$$GzErrorRatio(x,y,z)=\Delta Gz(x,y,z)/Gz \quad \text{Expression (1-3)}$$

Further, error distributions $\Delta Bgradx(x,y,z)$, $\Delta Bgrady(x,y,z)$, $\Delta Bgradz(x,y,z)$ of the static magnetic field due to the errors of the gradient magnetic field in the channels in the x, y, and z directions can be estimated from the amounts $\Delta Gx(x,y,z)$, $\Delta Gy(x,y,z)$, and $\Delta Gz(x,y,z)$ of the errors of the gradient magnetic field and the coordinates x, y, and z in the gantry coordinate system, as expressed in the following Expression (2-1), Expression (2-2), and Expression (2-3).

$$\Delta Bgradx(x,y,z)=\Delta Gx(x,y,z)\times x \quad \text{Expression (2-1)}$$

$$\Delta Bgrady(x,y,z)=\Delta Gy(x,y,z)\times y \quad \text{Expression (2-2)}$$

$$\Delta Bgradz(x,y,z)=\Delta Gz(x,y,z)\times z \quad \text{Expression (2-3)}$$

Further, the error of the static magnetic field due to only the magnet 21 for static magnetic field, as the second factor, is caused by an error between intensity of an ideal static magnetic field and that of an actual one. The error of the static magnetic field due to only the magnet 21 for static magnetic field has a characteristic that it sharply deteriorates upon increasing an FOV (FOV: field of view). In addition, the error of the static magnetic field due to only the magnet 21 for static magnetic field depends on the intensity of the gradient magnetic field and, however, is independent of the shape or the presence or absence of the object P in the static magnetic field.

In addition, the error of the static magnetic field, as the third factor, which is caused by the entering of the object P in the static magnetic field corresponds to the error of the static magnetic field caused by the difference in magnetic susceptibility due to the entering of the object P in the static magnetic field. The error of the static magnetic field due to the entering of the object P in the static magnetic field depends on the intensity of the gradient magnetic field, and further depends on the shape and the presence or absence of the object P in the static magnetic field.

Then, the error distribution of the static magnetic field is defined as the total of error elements of the static magnetic field due to the first to third factors. That is, $\Delta Box(x,y,z)$, $\Delta Boy(x,y,z)$, and $\Delta Boz(x,y,z)$ denote the error of the static magnetic field at coordinates x, y, and z in the gantry coordinate system, $\Delta Bgradx(x,y,z)$, $\Delta Bgrady(x,y,z)$, and $\Delta Bgradz(x,y,z)$ denote the error element due to the gradient magnetic field, $\Delta Bmag(x,y,z)$ denotes the error of the static magnetic field due to only the magnet 21 for static magnetic field, and $\Delta Bobj(x,y,z)$ denotes the error of the static magnetic field due to the entering of the object P in the static magnetic field. Then, Expression (3-1), Expression (3-2), and Expression (3-3) can be obtained.

$$\Delta Box(x,y,z) = \Delta Bgradx(x,y,z) + \Delta Bmag(x,y,z) + \Delta Bobj(x,y,z) \quad \text{Expression (3-1)}$$

$$\Delta Boy(x,y,z) = \Delta Bgrady(x,y,z) + \Delta Bmag(x,y,z) + \Delta Bobj(x,y,z) \quad \text{Expression (3-2)}$$

$$\Delta Boz(x,y,z) = \Delta Bgradz(x,y,z) + \Delta Bmag(x,y,z) + \Delta Bobj(x,y,z) \quad \text{Expression (3-3)}$$

Therefore, amounts $\Delta X$, $\Delta Y$ and $\Delta Z$ of distortion on the static magnetic field in the x, y and z directions of the gantry coordination system can be obtained based on the equations (3-1), (3-2) and (3-3) as shown in the equations (4-1), (4-2) and (4-3).

$$\Delta X = \Delta Box(x, y, z) / Gx$$
$$= GxErrorRatio(x, y, z) \times x + \{\Delta Bmag(x, y, z) + \Delta Bobj(x, y, z)\} / Gx \quad \text{Expression (4-1)}$$

$$\Delta Y = \Delta Boy(x, y, z) / Gy$$
$$= GyErrorRatio(x, y, z) \times y + \{\Delta Bmag(x, y, z) + \Delta Bobj(x, y, z)\} / Gy \quad \text{Expression (4-2)}$$

$$\Delta Z = \Delta Boz(x, y, z) / Gz$$
$$= GzErrorRatio(x, y, z) \times z + \{\Delta Bmag(x, y, z) + \Delta Bobj(x, y, z)\} / Gz \quad \text{Expression (4-3)}$$

In Expression (4-1), Expression (4-2), and Expression (4-3), a value $\{\Delta Bmag(x,y,z) + \Delta Bobj(x,y,z)\}$ can be obtained by executing pre-scanning (preparation scanning) for measuring the distribution of the static magnetic field, in advance to scanning for imaging. In the case of the scanning for imaging using an EPI sequence, the pre-scanning for measuring the distribution of the static magnetic fields can be executed together with the pre-scanning for adjusting a receiving gain of the EPI sequence and adjusting a delay time of the gradient magnetic field.

That is, it is possible to collect data for measuring the distribution of the static magnetic field (distribution diagram indicating the deviation from the central frequency with a phase) on the slice plane, set by executing the pre-scanning scanning for measuring the distribution of the static magnetic field. In this case, the resolution on the plane in the case of executing the pre-scanning for measuring the distribution of the static magnetic field can be coarser than the resolution on the plane in the case of executing the scanning for imaging.

One example of the pre-scanning for measuring the distribution of the static magnetic field is collecting two pieces of image data with mutually different TEs (echo times) according to Field Echo method. Then, as shown by the following Expression (5), the value $\{\Delta Bmag(x,y,z) + \Delta Bobj(x,y,z)\}$ can be obtained from a phase difference $\Delta\theta(x,y,z)$ between pixels of the image data collected by the pre-scanning for measuring the distribution of the static magnetic field.

$$\Delta\theta(x,y,z) = (TE1-TE2) \times \{\Delta Bmag(x,y,z) + \Delta Bobj(x,y,z)\} \quad \text{Expression (5)}$$

Wherein TE1 and TE2 are mutually different TEs.

That is, by differentiating the pieces of the image data collected with varying TE, the terms $\Delta Bgradx(x,y,z)$, $\Delta Bgrady(x,y,z)$, and $\Delta Bgradz(x,y,z)$ of the error $\Delta Box(x,y,z)$, $\Delta Boy(x,y,z)$, and $\Delta Boz(x,y,z)$ of the static magnetic field are canceled.

Therefore, by obtaining the error distribution $\Delta Bgradx(x,y,z)$, $\Delta Bgrady(x,y,z)$, and $\Delta Bgradz(x,y,z)$ of the static magnetic field due to the error of the gradient magnetic field, the error $\Delta Box(x,y,z)$, $\Delta Boy(x,y,z)$, and $\Delta Boz(x,y,z)$ of the static magnetic field and the distortion amount $\Delta X$, $\Delta Y$, and $\Delta Z$ of the static magnetic field can be obtained from Expression (3-1), Expression (3-2), Expression (3-3) and Expression (4-1), Expression (4-2), and Expression (4-3).

The gradient magnetic field measuring coil 51 can measure the error distribution $\Delta Bgradx(x,y,z)$, $\Delta Bgrady(x,y,z\}$, and $\Delta Bgradz(x,y,z)$ of the static magnetic field due to the error of the gradient magnetic field.

The gradient magnetic field measuring coil 51 measures the error distribution $\Delta Bgradx(x,y,z)$, $\Delta Bgrady(x,y,z)$, and $\Delta Bgradz(x,y,z)$ of the static magnetic field due to the error of the gradient magnetic field, and sends the measuring result to the magnetic field distribution calculating unit 49.

The imaging condition setting unit 46 generates a pulse sequence for the pre-scanning for measuring the distribution of the static magnetic field, and sends the generated pulse sequence to the sequence controller control unit 40. Therefore, the sequence controller control unit 40 sends the pulse sequence for measuring the distribution of the static magnetic field to the sequence controller 31 based on information from the input device 33 or another component, thereby executing the pre-scanning for measuring the distribution of the static magnetic field.

That is, the object P or a phantom is set on the bed 37 in advance, and the static magnetic field is formed in an imaging area of the magnet 21 (superconducting magnet), for the static magnetic field, excited by the static magnetic field power supply 26. The shim coil power supply 28 supplies current to the shim coil 22, and the static magnetic field formed in the imaging area becomes uniform.

Further, the sequence controller 31 drives the gradient magnetic field power supply 27, the transmitter 29, and the receiver 30 in accordance with the pulse sequence for measuring the distribution of the static magnetic field received from the sequence controller control unit 40, thereby forming, in the imaging area to which the object P or the phantom is set, the gradient magnetic field Gx on the X axis, the gradient magnetic field Gy on the Y axis, and the gradient magnetic field Gz on Z axis and generating an RF signal.

Therefore, the transmitter 29 transmits the RF signal to the RF coil 24 in accordance with the pulse sequence, and the RF coil 24 then transmits the RF signal to the object P. After the RF signal is transmitted to the object P, the RF coil 24 receives an MR signal generated by nuclear magnetic resonance of atomic nucleus in the object P and sends the MR signal to the receiver 30. The receiver 30 receives the MR signal from the RF coil 24, and executes various signal processing including pre-amplification, conversion of intermediate frequency, phase detection, amplification of low frequency, and filtering. Further, the receiver 30 A/D-converts the MR signal, thereby generating raw data of the MR signal, serving as digital data. Then, the receiver 30 supplies the generated raw data to the sequence controller 31.

The sequence controller 31 sends the raw data received from the receiver 30 to the sequence controller control unit 40, and the sequence controller control unit 40 inputs the raw data to the raw data database 41. As mentioned above, the twice pre-scanning for measuring the distribution of the static magnetic field according to the Field Echo method with varying TE is executed, and the raw data database 41 stores the raw data collected by the pre-scanning for measuring the distribution of the static magnetic field.

Then, the magnetic field distribution calculating unit 49 reads, from the raw data database 41, the raw data collected by executing the pre-scanning for measuring the distribution of the static magnetic field, and receives the error distribution $\Delta Bgradx(x,y,z)$, $\Delta Bgrady(x,y,z)$, and $\Delta Bgradz(x,y,z)$ of the static magnetic field due to the error of the gradient magnetic field from the gradient magnetic field measuring coil 51. Then, by using Expression (3-1), Expression (3-2), Expression (3-3), Expression (4-1), Expression (4-2), Expression (4-3) and Expression (5), the magnetic field distribution calculating unit 49 obtains the error $\Delta Box(x,y,z)$, $\Delta Boy(x,y,z)$, and $\Delta Boz(x,y,z)$ of the static magnetic field and the distortion amount $\Delta X$, $\Delta Y$, and $\Delta Z$ of the static magnetic field.

Further, the magnetic field distribution calculating unit 49 writes the obtained distortion amount $\Delta X$, $\Delta Y$, and $\Delta Z$ of the static magnetic field, as the static magnetic field distribution data, to the static magnetic field distribution database 44.

Incidentally, the error distribution $\Delta Bgradx(x,y,z)$, $\Delta Bgrady(x,y,z)$, and $\Delta Bgradz(x,y,z)$ of the static magnetic field due to the error of the gradient magnetic field can be obtained not only by the measurement of the gradient magnetic field measuring coil 51 but also by a simulation using a magnetic field model of the coordinate system.

In step S2, the imaging condition setting unit 46 generates pulse sequences for collecting the image of the object P, thereby setting imaging conditions. In this case, for example, the polarities of gradient magnetic fields in at least one of the PE direction, the RO direction and the SE direction in the generated pulse sequences for collecting the image are reversed mutually to obtain the two pulse sequences for executing the scanning under two imaging conditions.

The EPI sequences are an example of the generated pulse sequences for collecting the image, as mentioned above.

Figure 4:
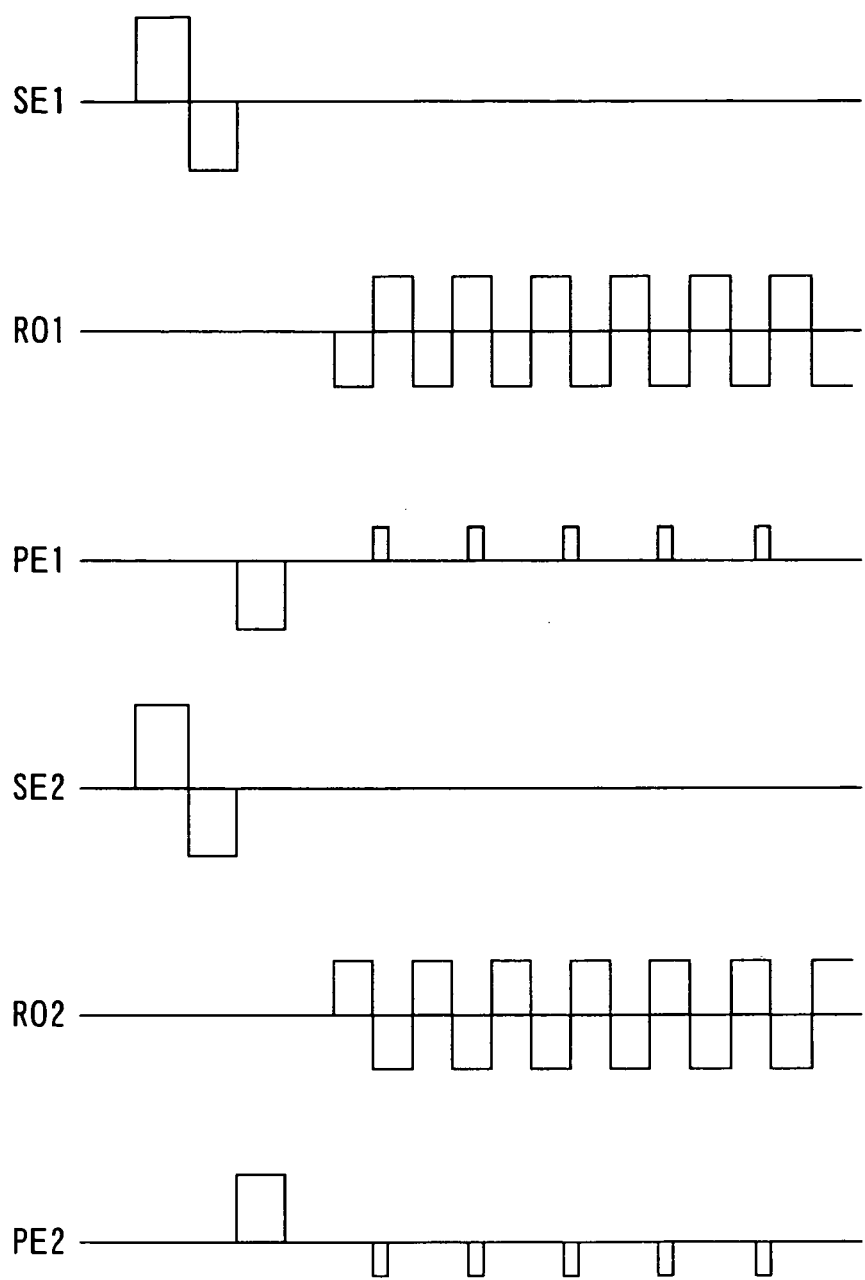
FIG. 4 is a diagram showing an example of a pulse sequence generated by the magnetic resonance imaging apparatus shown in FIG. 1 for estimating whether correction for image distortion due to nonuniformity on a static magnetic field is appropriate.

FIG. 4 is a diagram showing an example of a pulse sequence generated by the magnetic resonance imaging apparatus 20 shown in FIG. 1 for estimating whether correction for image distortion due to nonuniformity on a static magnetic field is appropriate.

Referring to FIG. 4, reference symbols SE1, RO1, and PE1 correspond to the first pulse sequence defining the gradient magnetic field in the SE direction, the RO direction and the PE direction respectively. Reference symbols SE2, RO2, and PE2 correspond to the second pulse sequence defining the gradient magnetic field in the SE direction, the RO direction and the PE direction respectively. As shown in FIG. 4, for example, the imaging condition setting unit 46 generates the two first and second pulse sequences so as to execute the scanning under the two imaging conditions in which the polarities of the gradient magnetic fields in two directions of the PE direction and the RO direction are mutually reversed.

Then, the sequence controller control unit 40 receives the two pulse sequences generated by the imaging condition setting unit 46.

In step S3, the scanning is executed under the two imaging conditions set by the imaging condition setting unit 46, thereby reconstructing pieces of the image data. That is, the sequence controller control unit 40 supplies the two pulse sequences for collecting the images to the sequence controller 31 based on the information from the input device 33 or another component, thereby executing scanning for collecting the images.

As a result, each piece of the raw data, obtained with mutually reversing the polarities of the gradient magnetic fields, is arranged in k-space formed in the raw data database 41 every imaging condition.

Further, the image reconstructing unit 42 captures each piece of the raw data from the raw data database 41 and performs predetermined image reconstruction processing, such as Fourier transform processing, to each piece of the raw data, thereby reconstructing two pieces of the image data. Since the above-obtained pieces of image data are reconstructed from the pieces of the raw data collected with reversing the gradient magnetic fields mutually, the pieces of image data have mutually different distortions. Then, each piece of the image data is written and stored to the image data database 43.

In step S4, the pieces of image data with the mutually different distortions stored in the image data database 43 are read to the image distortion correcting unit 45, and the distortion of each piece of the image data is corrected based on the distribution of the static magnetic field stored in the static magnetic field distribution database 44.

Figure 5:
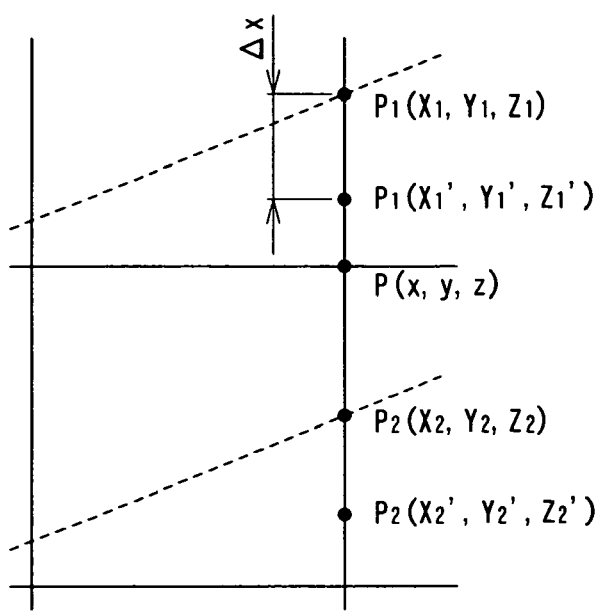
FIG. 5 is an explanatory diagram showing an example of method for correcting image data based on a static magnetic field distribution by the magnetic resonance imaging apparatus shown in FIG. 1.

FIG. 5 is an explanatory diagram showing an example of method for correcting image data based on a static magnetic field distribution by the magnetic resonance imaging apparatus 20 shown in FIG. 1.

The distortion amount on each piece of the image data is obtained every position in the image space in accordance with the distribution of the static magnetic field. For example, when a serious distortion exists only in the x direction, a distortion amount $\Delta x$ in the x direction is obtained. Then, based on the distortion amount $\Delta x$ in the x direction, image values P1 (X1,Y1,Z1) and P2 (X2,Y2,Z2) at coordinates (X1,Y1,Z1) and (X2,Y2,Z2) of two positions after the distortion are changed into image values P1 (X1',Y1',Z1') and P2 (X2',Y2',Z2') at coordinates (X1',Y1',Z1') and (X2',Y2',Z2') before the distortion. That is, the positions (X1,Y1,Z1) and (X2,Y2,Z2) of the image values P1 (X1,Y1,Z1) and P2 (X2, Y2,Z2) are shifted by the distortion amount $\Delta x$ in the x direction.

Further, an image value P (x,y,z) at coordinates (x,y,z) of the original grid point is obtained every position in the image space by interpolation using the image values P1 (X1',Y1', Z1') and P2 (X2',Y2',Z2') of the positions (X1',Y1',Z1') and (X2',Y2',Z2') near the coordinates (x,y,z) of the grid point. In this case, generally, the interpolation uses a function of cubic spline or more, and using a linear function is not sufficient because of a large blur.

Then, as mentioned above, the two pieces of image data after the correction obtained by the image distortion correcting unit 45 are sent to the cross-correlation calculating unit 47 and the signal intensity comparing unit 48.

In step S5, the cross-correlation calculating unit 47 calculates a cross-correlation coefficient between the pieces of the image data after the correction, obtained under the two imaging conditions in which the gradient magnetic fields are reversed mutually to evaluate the propriety of the correction of the pieces of the image data based on the obtained cross-correlation coefficient.

That is, the collecting conditions of the two pieces of the image data are substantially the same, except for mutual reversal of the directions of polarities of the gradient magnetic fields. Therefore, as the distortion of the image data is more appropriately corrected, the shapes of objects of the pieces of the image data match each other to lead consideration that the cross-correlation between the two pieces of image data is increased and the cross-correlation coefficient is thus larger. On the other hand, when the distortion of the image data is not appropriately corrected, the cross-correlation between the two pieces of the image data is reduced and the cross-correlation coefficient is thus smaller.

Then, the cross-correlation calculating unit 47 compares, with a preset threshold, the cross-correlation coefficient between the two pieces of the image data. When the cross-correlation calculating unit 47 determines that the cross-correlation coefficient is the threshold or more, it evaluates the propriety of the correction. On the other hand, when the cross-correlation coefficient is the threshold or less, the cross-correlation calculating unit 47 determines that the correction is not appropriately performed.

The cross-correlation calculating unit 47 sends the evaluation result indicating the propriety of the correction of the image data and the obtained cross-correlation coefficient between the two pieces of the image data to the display unit 34 to display them if necessary. Therefore, a user can easily understand the propriety of the correction of the image data.

In step S6, the signal intensity comparing unit 48 compares the signal intensities of the pieces of the image data, which are obtained through the two imaging conditions with the mutually reversed gradient magnetic fields, after the correction every pixel to evaluate the propriety of the correction of each piece of the image data based on the comparing result of the signal intensities.

That is, since the collecting conditions of the two pieces of the image data are the substantially the same, except for the mutual reversal of the directions of polarities of gradient magnetic fields as mentioned above, the shapes of objects of the pieces of the image data match each other, as the correction of distortion on each piece of the image data is more appropriate. Further, this case leads consideration that the difference in signal intensities of the two pieces of the image data is smaller. On the other hand, when the correction of distortion on each piece of the image data is not appropriate, it is considered that the difference of the signal intensities of the two pieces of the image data is larger.

Then, the signal intensity comparing unit 48 compares the differential value in signal intensities of the two pieces of the image data with a preset threshold. The signal intensity comparing unit 48 evaluates that the correction is not appropriate when the differential value of the signal intensities is the threshold or more. On the other hand, when the differential value of the signal intensities is the threshold or less, the signal intensity comparing unit 48 evaluates that the correction is appropriate.

The signal intensity comparing unit 48 47 sends the evaluation result indicating the propriety of the correction of the image data and the obtained differential value in the signal intensities of the two pieces of the image data to the display unit 34 to display them if necessary. Therefore, a user can easily understand the propriety of the correction of the image data.

In step S7, at least one of the cross-correlation calculating unit 47 and the signal intensity comparing unit 48 determines that the correction of the image data is not appropriate, the cross-correlation calculating unit 47 and/or the signal intensity comparing unit 48 sends the feedback instruction to the feedback unit 50 so as to appropriately correct the image data.

In this case, when an area serving the determination that the correction is not appropriate partly exists, the area serving the determination that the correction is not appropriate is also notified from the cross-correlation calculating unit 47 and/or the signal intensity comparing unit 48 to the feedback unit 50. If necessary, the amount of divergence from the threshold of the cross-correlation coefficient is notified from the cross-correlation calculating unit 47 to the feedback unit 50. The amount of divergence from the threshold of the differential value of the signal intensities is notified from the signal intensity comparing unit 48 to the feedback unit 50.

Then, in step S8, feedback processing for correction is performed with an arbitrary pre-designated method. Here, a description is given of the case of designating in the feedback unit 50, as the feedback processing, any of a method for increasing the order of the approximated curve stored, as the static magnetic field distribution data, in the static magnetic field distribution database 44, a method for varying values of the static magnetic field distribution data in one direction to recorrect the image data, and a method for recollecting the data after varying a shimming condition to improve the uniformity of the distribution of the static magnetic field.

In the case of selecting the method for increasing the order of the approximated curve indicating the static magnetic field distribution data, the cross-correlation calculating unit 47 or the signal intensity comparing unit 48 sends the feedback instruction to the approximated curve order varying unit 50A.

Then, in step S8A, the approximated curve order varying unit 50A sends an instruction for increasing the order of the approximated curve stored in the static magnetic field distribution database 44, as the static magnetic field distribution data to the magnetic field distribution calculating unit 49. Further, the approximated curve order varying unit 50A sends an instruction for executing the correction of the image data using the static magnetic field distribution data which is newly obtained by the magnetic field distribution calculating unit 49 to the image distortion correcting unit 45. Therefore, the magnetic field distribution calculating unit 49 increases the order of the approximated curve to recalculate the static magnetic field distribution data.

In step S4 again, the image distortion correcting unit 45 executes the correction of the image data using the newly-obtained static magnetic field distribution data. In this case, the increase in the order of the approximated curve serving as the static magnetic field distribution data improves the approximating precision of the static magnetic field distribution. Therefore, it is possible to improve the precision in distortion correction of the image based on the static magnetic field distribution data.

However, when the area serving the determination that the distortion correction of the image data is not appropriate partly exists, the area serving the determination that the distortion correction of the image data is not appropriate may be notified from the approximated curve order varying unit 50A to the magnetic field distribution calculating unit 49 and/or the image distortion correcting unit 45 to calculate the static magnetic field distribution data and/or correct the image data only for the area. The area limitation can reduce the throughput.

Similarly, in steps S5 and S6, the cross-correlation calculating unit 47 and the signal intensity comparing unit 48 determines whether or not the correction of the image data is appropriate. In step S7, the above-mentioned feedback processing is repeated until determining that the correction of the image data is appropriate.

In the case of selecting, as the feedback processing, the method for varying the values of the static magnetic field distribution data in one direction to recorrect the image data, the cross-correlation calculating unit 47 or the signal intensity comparing unit 48 sends the feedback instruction to the recorrection indicating unit 50B. In this case, the cross-correlation calculating unit 47 and/or the signal intensity comparing unit 48 sends a notification indicating the amount of divergence from the threshold of the cross-correlation coefficient and/or that of the differential value of the signal intensities to the recorrection indicating unit 50B.

Then, in step S8B, the recorrection indicating unit 50B sends an instruction for varying the value of the static magnetic field distribution data used for correction in one direction to recorrect the image data to the image distortion correcting unit 45.

Therefore, in step S4 again, the recorrection indicating unit 50B varies the values of the static magnetic field distribution data in one direction so as to recorrect the image data. In steps S5 and S6, the cross-correlation calculating unit 47 and the signal intensity comparing unit 48 determines whether or not the correction of the image data is appropriate.

When the direction for varying the static magnetic field distribution data is not appropriate, the amount of divergence from the threshold of the cross-correlation coefficient or that of the differential value of the signal intensities are/is increased. Thus, in step S7, the cross-correlation calculating unit 47 and the signal intensity comparing unit 48 determine that the correction of the image data is not appropriate.

In this case, in step S8B, the recorrection indicating unit 50B determines that the direction for varying the static magnetic field distribution data is not one for improving the correction since the amount of divergence from the threshold of the cross-correlation coefficient or that of the differential value of the signal intensities is increased. Then, the recorrection indicating unit 50B sends an instruction for varying the static magnetic field distribution data in the reversed direction to recorrect the image data to the image distortion correcting unit 45.

On the other hand, even when the direction for varying the static magnetic field distribution data is appropriate and the amount of divergence from the threshold of the cross-correlation coefficient or that of the differential value of the signal intensities is reduced, the cross-correlation coefficient or the differential value of the signal intensities cannot be within each range of the threshold thereof. In this case, similarly, in step S7, the cross-correlation calculating unit 47 and the signal intensity comparing unit 48 determine that the correction of the image data is not appropriate.

In this case, in step S8B, the recorrection indicating unit 50B determines that the direction for varying the static magnetic field distribution data is one for improving the correction since the amount of divergence from the threshold of the cross-correlation coefficient or that of the differential value of the signal intensities is reduced. Then, the recorrection indicating unit 50B sends an instruction for varying again the static magnetic field distribution data in the same direction to correct the image data to the image distortion correcting unit 45.

In step S7, the above-mentioned feedback processing is repeated until determining that the correction of the image data is appropriate. When the direction for varying the static magnetic field distribution data changes from the direction for improving the correction to the direction for improving no correction as the repeating result of varying the static magnetic field distribution data, it is considered that the optimal values of the static magnetic field distribution data are between the values after/before the change. In such a case, the recorrection indicating unit 50B reverses the varying direction of the static magnetic field distribution data with setting the amount of variation to be small.

When the area serving the determination that the distortion correction of the image data is not appropriate partly exists, the recorrection indicating unit 50B may send a notification indicating the area serving the determination that the distortion correction of the image data is not appropriate to the image distortion correcting unit 45 so as to correct the image data only for the area. The above-mentioned area limitation can reduce the throughput.

In addition, in the case of selecting, as the feedback processing, the method for recollecting the data after varying the shimming condition to improve the uniformity of the distribution of the static magnetic field, the cross-correlation calculating unit 47 or the signal intensity comparing unit 48 sends the feedback instruction to the shimming unit 50C.

Then, in step S8C, the shimming unit 50C refers to the shimming condition table which connects the shimming conditions with degrees of the uniformity of the distribution of the static magnetic field in advance to set the shimming condition so as to improve the uniformity of the distribution of the static magnetic field. The shimming unit 50C sends a control signal to the shim coil power supply 28 under the set shimming-condition, thereby controlling current or voltage outputted to the shim coil 22 from the shim coil power supply 28. Thus, shimming is performed under the reset shimming condition, thereby improving the uniformity of the distribution of the static magnetic field.

Therefore, the reexecution of scanning enables not only the collection of the image data with a uniform distribution of static magnetic field but also the uniformity of the static magnetic field distribution data used for correction. Consequently, the correcting precision of the image data can be improved.

Then, in step S7, the processing, scanning and above-mentioned feedback processing in steps S1 to S6 are repeated until determining that the correction of the image data is appropriate.

As mentioned above, when the cross-correlation calculating unit 47 and the signal intensity comparing unit 48 determines in step S7 that the correction of the image data is appropriate, the feedback processing of the correction of the image data is not performed and the image data with the preferably-corrected distortion are displayed on the display unit 34. Therefore, a user can refer to the image data with the appropriately-corrected distortion for diagnosis.

Incidentally, the above description has been given of the case of the example of instructing the feedback processing according to the single method. However, according to the present invention, the feedback processing according to a plurality of methods may be commonly performed in accordance with the designated priority. For example, when the image data is not appropriately corrected yet by repeating the operation for increasing an order of an approximated curve serving as static magnetic field distribution data and the operation for varying the static magnetic field distribution data in one direction predetermined times, the data may be recollected after the shimming operation.

That is, the above-mentioned magnetic resonance imaging apparatus 20 reverses the gradient magnetic fields mutually to form two pieces of image data, and evaluates the propriety of the correction based on result of the comparing of the signal intensities and/or the cross-correlation of the two pieces of image data after the distortion correction.

In addition, when it is evaluated that the correction is not appropriate, the feedback processing is performed for appropriate correction.

Therefore, the magnetic resonance imaging apparatus 20 appropriately estimates the error distribution of a static magnetic field formed in the imaging area and evaluates the propriety of the correction of the image distortion due to the nonuniformity of the static magnetic field.

In particular, in the imaging operation using an EPI sequence which is greatly influenced from the nonuniformity of intensities of a static magnetic field, there is a danger that the correction of the image distortion is not appropriate. However, the magnetic resonance imaging apparatus 20 can evaluate the propriety of the correction of the image distortion.

Even when the correction of the image distortion is not appropriate, the feedback processing enables the final acquisition of the appropriately corrected image data.

Incidentally, the functions and the processing of the magnetic resonance imaging apparatus 20 may be partly omitted and the processing sequence may be changed. Further, the number of imaging conditions is not limited to two, and three or more imaging conditions may be used, including, e.g., an imaging condition, serving as the reference, an imaging condition in which the gradient magnetic field only in the SE direction is reversed to that of the reference imaging condition, and an imaging condition in which the gradient magnetic field only in the RO direction is reversed to that of the reference imaging condition.

Further, according to the embodiment, the correction of the image distortion due to the nonuniformity of intensities of a static magnetic field is evaluated. However, the present invention is not limited to the correction of the image distortion due to the nonuniformity of the static magnetic field, and the result of the correction of the image distortion due to the nonuniformity of intensities of a gradient magnetic field can be evaluated based on the similar principle. That is, it is possible to evaluate the result of the correction of the image distortion in accordance with the distribution of intensities of a gradient magnetic field based on the cross-correlation and/or the difference of the signal intensities between a plurality of images which are obtained under different imaging conditions and are distortion-corrected in accordance with the nonuniformity of distributions of gradient magnetic fields.

Further, upon evaluating that the correction of the image distortion is not appropriate, the feedback processing can obtain the appropriately-corrected image data.

What is claimed is:

1. A magnetic resonance imaging apparatus comprising:
   an imaging condition setting unit configured to set mutually different image conditions;
   a receiving unit configured to receive magnetic resonance signals from an imaging area according to the image conditions;
   an image reconstructing unit configured to reconstruct a plurality of image data corresponding to the image conditions respectively based on the magnetic resonance signals;
   an image distortion correcting unit configured to correct distortions of the plurality of the image data based on a magnetic field distribution on the imaging area; and
   an image correction estimating unit configured to estimate whether a correction of at least one of the plurality of the image data is appropriate based on a plurality of corrected image data;
   wherein the imaging condition setting unit is configured to set imaging conditions of which polarities of gradient magnetic field in at least one of a phase encode direction, a read out direction and a slice encode direction are mutually reversed.

2. A magnetic resonance imaging apparatus according to claim 1, wherein the image distortion correcting unit is configured to correct the distortions of the plurality of the image data based on a static magnetic field distribution on the imaging area.

3. A magnetic resonance imaging apparatus according to claim 1, wherein the image distortion correcting unit is configured to correct the distortions of the plurality of the image data based on a gradient magnetic field distribution on the imaging area.

4. A magnetic resonance imaging apparatus according to claim 1, wherein the imaging condition setting unit is configured to set imaging conditions for obtaining a sufficient difference in either of pixel values and signal values of the plurality of the image data.

5. A magnetic resonance imaging apparatus according to claim 1, wherein the imaging condition setting unit is configured to set imaging conditions according to EPI method.

6. A magnetic resonance imaging apparatus according to claim 1, further comprising a display unit configured to display an estimation result by the image correction estimating unit.

7. A magnetic resonance imaging apparatus according to claim 1, further comprising a feedback unit configured to perform feedback of an estimation result by the image correction estimating unit.

8. A magnetic resonance imaging apparatus according to claim 7, wherein the feedback unit is configured to make the image distortion correcting unit correct the distortions of the plurality of the image data with varying the magnetic field distribution.

9. A magnetic resonance imaging apparatus according to claim 7, wherein the feedback unit is configured to make the image distortion correcting unit correct the distortions of the plurality of the image data with increasing an order of an approximated curve representing the magnetic field distribution.

10. A magnetic resonance imaging apparatus according to claim 7, wherein the feedback unit is configured to make the image distortion correcting unit correct distortions of a plurality of image data reconstructed based on magnetic resonance signals received after shimming.

11. A magnetic resonance imaging apparatus comprising:
    an imaging condition setting unit configured to set mutually different image conditions;
    a receiving unit configured to receive magnetic resonance signals from an imaging area according to the image conditions;
    an image reconstructing unit configured to reconstruct a plurality of image data corresponding to the image conditions respectively based on the magnetic resonance signals;
    an image distortion correcting unit configured to correct distortions of the plurality of the image data based on a magnetic field distribution on the imaging area; and
    an image correction estimating unit configured to estimate whether a correction of at least one of the plurality of the image data is appropriate based on a plurality of corrected image data;
    wherein the image correction estimating unit is configured to obtain a cross-correlation coefficient between the plurality of the corrected image data to estimate whether the correction of at least the one of the plurality of the image data is appropriate based on the cross-correlation coefficient.

12. A magnetic resonance imaging apparatus comprising:
    an imaging condition setting unit configured to set mutually different image conditions;
    a receiving unit configured to receive magnetic resonance signals from an imaging area according to the image conditions;
    an image reconstructing unit configured to reconstruct a plurality of image data corresponding to the image conditions respectively based on the magnetic resonance signals;

an image distortion correcting unit configured to correct distortions of the plurality of the image data based on a magnetic field distribution on the imaging area; and an image correction estimating unit configured to estimate whether a correction of at least one of the plurality of the image data is appropriate based on a plurality of corrected image data;

wherein the image correction estimating unit is configured to estimate whether the correction of at least the one of the plurality of the image data is appropriate by comparing one signal intensity of the plurality of the corrected image data with another every pixel.

13. An image correction estimating method comprising steps of:

setting mutually different image conditions;

receiving magnetic resonance signals from an imaging area according to the image conditions;

reconstructing a plurality of image data corresponding to the image conditions respectively based on the magnetic resonance signals;

correcting distortions of the plurality of the image data based on a magnetic field distribution on the imaging area; and estimating whether a correction of at least one of the plurality of the image data is appropriate based on a plurality of corrected image data;

wherein imaging conditions of which polarities of gradient magnetic field in at least one of a phase encode direction, a read out direction and a slice encode direction are mutually reversed are set.

14. An image correction estimating method according to claim 13, wherein the distortions of the plurality of the image data are corrected based on a static magnetic field distribution on the imaging area.

15. An image correction estimating method according to claim 13, wherein the distortions of the plurality of the image data are corrected based on a gradient magnetic field distribution on the imaging area.

16. An image correction estimating method according to claim 13, wherein imaging conditions for obtaining a sufficient difference in either of pixel values and signal values of the plurality of the image data are set.

17. An image correction estimating method according to claim 13, wherein imaging conditions according to EPI method are set.

18. An image correction estimating method according to claim 13, further comprising a step of displaying an estimation result showing whether the correction is appropriate.

19. An image correction estimating method according to claim 13, further comprising a step of performing feedback of an estimation result showing whether the correction is appropriate.

20. An image correction estimating method according to claim 19, wherein the distortions of the plurality of the image data are corrected with varying the magnetic field distribution.

21. An image correction estimating method according to claim 19, wherein the distortions of the plurality of the image data are corrected with increasing an order of an approximated curve representing the magnetic field distribution.

22. An image correction estimating method according to claim 19, wherein distortions of a plurality of image data reconstructed based on magnetic resonance signals received after shimming are corrected.

23. An image correction estimating method comprising steps of:

setting mutually different image conditions;

receiving magnetic resonance signals from an imaging area according to the image conditions;

reconstructing a plurality of image data corresponding to the image conditions respectively based on the magnetic resonance signals;

correcting distortions of the plurality of the image data based on a magnetic field distribution on the imaging area; and estimating whether a correction of at least one of the plurality of the image data is appropriate based on a plurality of corrected image data;

wherein a cross-correlation coefficient between the plurality of the corrected image data is obtained to estimate whether the correction of at least the one of the plurality of the image data is appropriate based on the cross-correlation coefficient.

24. An image correction estimating method comprising steps of:

setting mutually different image conditions;

receiving magnetic resonance signals from an imaging area according to the image conditions;

reconstructing a plurality of image data corresponding to the image conditions respectively based on the magnetic resonance signals;

correcting distortions of the plurality of the image data based on a magnetic field distribution on the imaging area; and estimating whether a correction of at least one of the plurality of the image data is appropriate based on a plurality of corrected image data;

wherein whether the correction of at least the one of the plurality of the image data is appropriate is estimated by comparing one signal intensity of the plurality of the corrected image data with another every pixel.

* * * * *